US008346526B1

(12) United States Patent
Portal et al.

(10) Patent No.: US 8,346,526 B1
(45) Date of Patent: *Jan. 1, 2013

(54) TEST ENVIRONMENT FOR ACCUMULATING CUMULATIVE METRIC DATA

(75) Inventors: Christian A. Portal, Holliston, MA (US); Michael J. Thomas, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 416 days.

This patent is subject to a terminal disclaimer.

(21) Appl. No.: 11/647,595

(22) Filed: Dec. 29, 2006

(51) Int. Cl.
*G06F 17/50* (2006.01)
*G06G 7/62* (2006.01)

(52) U.S. Cl. ......................................................... 703/13
(58) Field of Classification Search ....................... 703/13
See application file for complete search history.

(56) References Cited

U.S. PATENT DOCUMENTS

| 6,141,630 | A | 10/2000 | McNamara et al. | |
|---|---|---|---|---|
| 2004/0216023 | A1* | 10/2004 | Maoz et al. | 714/742 |

OTHER PUBLICATIONS

SimuLink Model Based and System Based Design, Version 5. Jul. 2002.*
"Using Model Coverage Analysis to Improve the Controls Development Process," Aldrich, William, *American Institute of Aeronautics and Astronautics*, pp. 1-11 (no date).
"Manage tests and analyze results for system verification and validation," System Test 1, *The MathWorks*, www.mathworks.com (2 pp.) 2006.
"Simulink® Verification and Validation," *The MathWorks*, http://www.mathworks.com/access/helpdesk/help/toolbox/slvnv/, Feb. 1, 2007.
"Manage tests and analyze results for system verification and validation," System Test 1.0.1, *The MathWorks*, http://www.mathworks.com/products/systemtest/ (1 p.), 2006.
"New Test Management Tool for System Verification and Validation," *The MathWorks*, http://www.mathworks.com/cmspro/webconf12496.html1 (pp. 1-12), Feb. 1, 2007.
Aldrich, W. J., "Using model coverage analysis to Improve the Controls Development Process," Proc. AIAA Modeling and Simulation Technologies Conf. and Exhibit, Aug. 2002, pp. 1-11.
SystemTest 1 Manage Tests and Analyze Results for System Verification and Validation, The MathWorks, Inc., Natick, MA, May 2006, pp. 1-2.
Simulink Verification and Validation, The MathWorks, Inc., Sep. 2005, pp. i-vi, 4-1 to 4-22, 5-1 to 5-58, and Index1 to Index-4.

(Continued)

*Primary Examiner* — Saif Alhija
(74) *Attorney, Agent, or Firm* — Cesari and McKenna, LLP; Michael R. Reinemann

(57) ABSTRACT

Generating cumulative metric data for a test in a test environment includes: generating in the test environment a test for a simulation model of a system under test; generating in the test environment at least one test condition for the test, the at least one test condition determining a plurality of iterations of the simulation model; generating in the test environment at least one temporary test variable for the test; generating in the test environment at least one mapping between a metric setting for the simulation model and one of the temporary test variables; running in the test environment the test for the plurality of iterations, wherein metric data for the simulation model is generated for each mapping and for each iteration of the test; and accumulating in the test environment the generated metric data for each mapping and for each iteration of the test to obtain cumulative metric data for the simulation model.

21 Claims, 11 Drawing Sheets

OTHER PUBLICATIONS

"Simulink Verification and Validation," User's Guide: Version 1, The MathWorks, Inc., Sep. 2005, pp. i-vi, 1- 1 to 1-6, 2-1 to 2-58, 3-1 to 3-30, 4-1 to 4-22, 5-1 to 5-58, 6-1 to 6-24, 7-1 to 7-2, 8-1 to 8-8, 9-1 to 9-4, A-1 to A-6 and Index-1 to Index-4.

"SystemTest," User's Guide: Version 1, The MathWorks, Inc., Mar. 2006, pp. i-vi, 1-1 to 1-36, 2-1 to 2-14, 3-1 to 3-24, 4-1 to 4-12, 5-1 to 5-14, 6-1 to 6-10, 7-1 to 7-36, A-1 to A-2 and Index-1 to Index-4.

* cited by examiner

TEST ENVIRONMENT FOR ACCUMULATING CUMULATIVE METRIC DATA

BACKGROUND

In developing a test for a simulation model of a system under test, a test engineer may desire to understand how well the test covers the simulation model. The test engineer may validate the simulation model by exercising the simulation model for various test conditions specified by the test. Model coverage may determine the extent to which the test exercises simulation pathways through the simulation model and may offer a measure of how thoroughly the test tests the simulation model. Hence, model coverage helps a test engineer validate the test being developed for the simulation model. Existing test environments for developing a test do not provide a convenient way for incorporating model coverage into a design cycle for the test. In addition, existing test environments for developing a test may require intensive manual input by the test engineer to validate the test.

SUMMARY

In one embodiment, the invention may be a computer-implemented method to generate cumulative metric data for a test in a test environment. The method includes: generating at least one temporary test variable for a test having one or more test conditions associated therewith, the one or more test conditions for determining a plurality of iterations associated with a simulation model; generating at least one mapping between a metric setting for the simulation model and the at least one temporary test variable; generating metric data for the simulation model based on the at least one mapping and one or more iterations of the test, wherein the generating is based on running the test according to the one or more test conditions; and producing cumulative metric data for the simulation model for the at least one mapping and the one or more iterations of the test based on the generated metric data.

In another embodiment, the invention may be a computer-readable medium having software, which when executed by a computer system causes the computer system to perform operations in a computing environment to generate a test in a test environment. The operations include: generating at least one temporary test variable for a test having one or more test conditions associated therewith, the one or more test conditions for determining a plurality of iterations associated with a simulation model; generating at least one mapping between a metric setting for the simulation model and the at least one temporary test variable; generating metric data for the simulation model based on the at least one mapping and one or more iterations of the test, wherein the generating is based on running the test according to the one or more test conditions; and producing cumulative metric data for the simulation model for the at least one mapping and the one or more iterations of the test based on the generated metric data.

A system to generate a test in a test environment including: means for generating at least one temporary test variable for a test having one or more test conditions associated therewith, the one or more test conditions for determining a plurality of iterations associated with a simulation model; means for generating at least one mapping between a metric setting for the simulation model and the at least one temporary test variable; means for generating metric data for the simulation model based on the at least one mapping and one or more iterations of the test, wherein the generating is based on running the test according to the one or more test conditions; and means for producing cumulative metric data for the simulation model for the at least one mapping and the one or more iterations of the test based on the generated metric data.

Further features of the invention, as well as the structure and operation of various embodiments of the invention, are described in detail below with reference to the accompanying drawings.

BRIEF DESCRIPTION OF THE DRAWINGS

The foregoing and other features of the invention will be apparent from the following, more particular description of exemplary embodiments of the invention, as illustrated in the accompanying drawings wherein like reference numbers generally indicate identical, functionally similar, and/or structurally similar elements. The left most digits in the corresponding reference number indicate the drawing in which an element first appears.

DEFINITIONS

Figure 1:
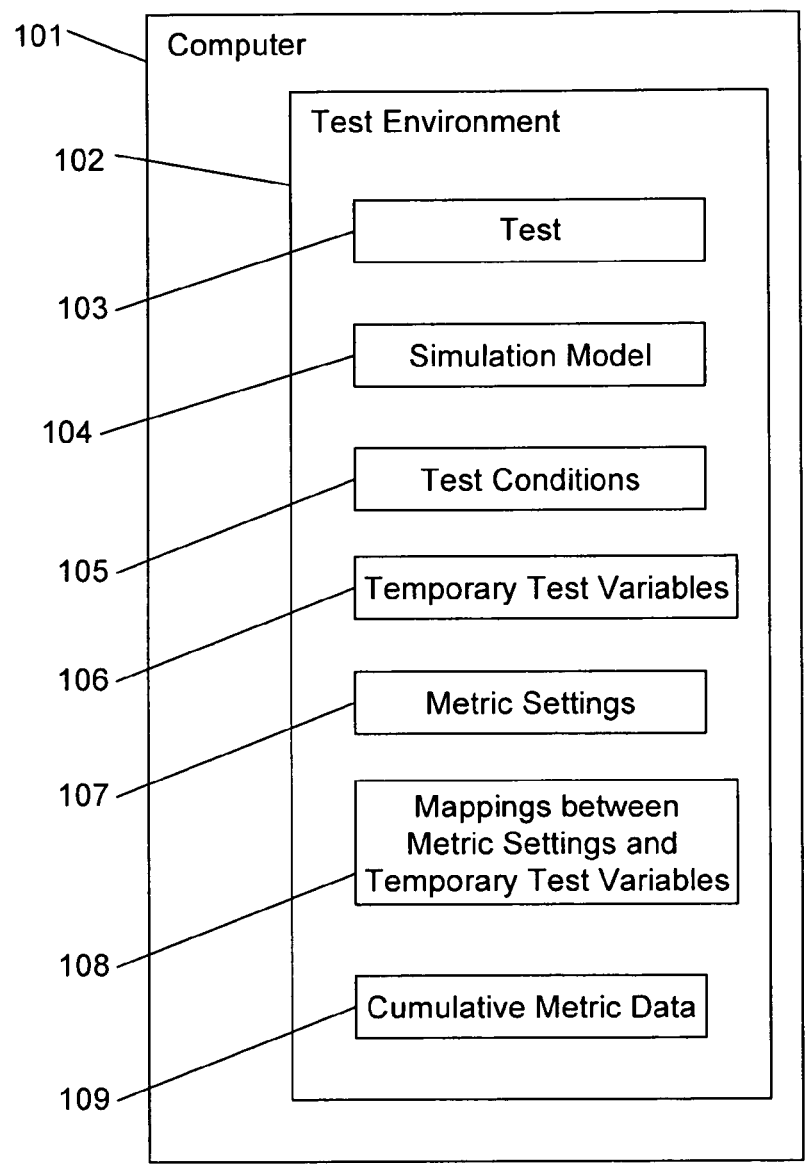
FIG. 1 depicts an exemplary system overview for an exemplary embodiment of the invention.

In describing the invention, the following definitions are applicable throughout (including above).

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a microcomputer; a server; a client; an interactive television; a web appliance; a telecommunications device with interne access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, or a chip set; a system-on-chip (SoC) or a multiprocessor system-on-chip (MPSoC); an optical computer; a quantum computer; a biological computer; and an apparatus that may accept data, may process data in accordance with one or more stored software programs, may generate results, and typically may include input, output, storage, arithmetic, logic, and control units.

"Software" may refer to prescribed rules to operate a computer. Examples of software may include: software; code segments; instructions; applets; pre-compiled code; compiled code; computer programs; and programmed logic.

A "computer-readable medium" may refer to any storage device used for storing data accessible by a computer. Examples of a computer-readable medium may include: a magnetic hard disk; a floppy disk; an optical disk, such as a CD-ROM and a DVD; a magnetic tape; a memory chip; and/or other types of media that can store machine-readable instructions thereon.

A "computer system" may refer to a system having one or more computers, where each computer may include a computer-readable medium embodying software to operate the computer. Examples of a computer system may include: a distributed computer system for processing information via computer systems linked by a network; two or more computer systems connected together via a network for transmitting and/or receiving information between the computer systems; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those that may be made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an internet, such as the Internet; an intranet; a local area network (LAN); a wide area network (WAN); and a combination of networks, such as an internet and an intranet. Exemplary networks may operate with any of a number of protocols, such as Internet protocol (IP), asynchronous transfer mode (ATM), and/or synchronous optical network (SONET), user datagram protocol (UDP), IEEE 802.x, etc.

DETAILED DESCRIPTION OF EXEMPLARY EMBODIMENTS

Exemplary embodiments of the invention are discussed in detail below. While specific exemplary embodiments are discussed, it should be understood that this is done for illustration purposes only. In describing and illustrating the exemplary embodiments, specific terminology is employed for the sake of clarity. However, the invention is not intended to be limited to the specific terminology so selected. A person skilled in the relevant art will recognize that other components and configurations may be used without parting from the spirit and scope of the invention. It is to be understood that each specific element includes all technical equivalents that operate in a similar manner to accomplish a similar purpose. Each reference cited herein is incorporated by reference. The examples and embodiments described herein are non-limiting examples.

Figure 2:
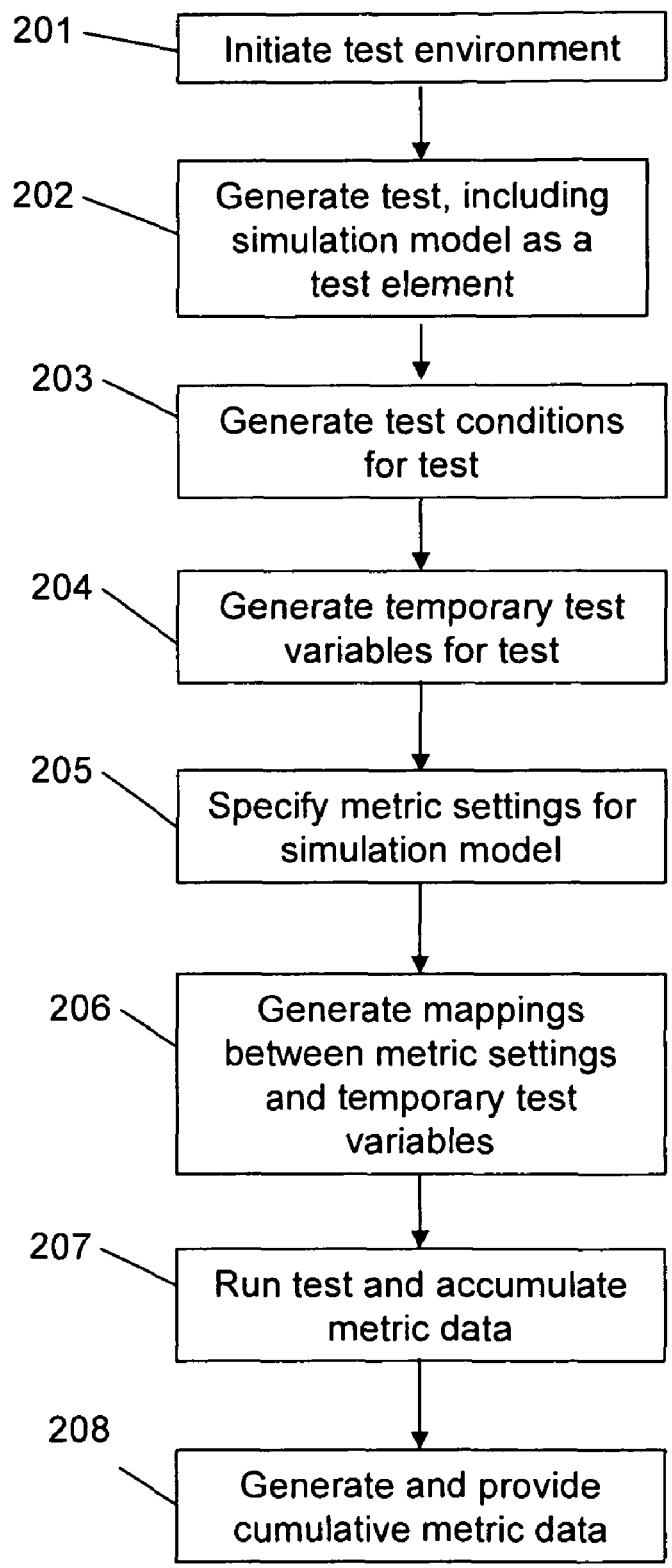
FIG. 2 depicts a flow chart for an exemplary embodiment of the invention.

FIG. 1 depicts an exemplary system overview for an exemplary embodiment of the invention, and FIG. 2 depicts a flow chart for an exemplary embodiment of the invention. In explaining the invention, exemplary graphical user interfaces for an exemplary test environment are described, as depicted in FIGS. 3, 4, 6, 7, and 9-11. The exemplary graphical user interfaces do not necessarily reflect information from the same test.

In block 201, a test environment 102 may be initiated on a computer 101, a computer system, or the like. The test environment 102 may be used to develop and validate a test 103 for a simulation model 104 of a system under test. The test environment 102 may be based on, for example, SystemTest by The MathWorks, Inc. of Natick, Mass. The system under test may be, for example, a software algorithm, a hardware device, a unit under test, or a system model.

The simulation model 104 may be, for example, code generated or created with an array-based mathematical programming language, such as, for example, MATLAB® by The MathWorks, Inc., or others, including any other language that may include at least some commands that are executable in the MATLAB® computing environment, such as, for example, Octave, Python, and Comsol Script. The simulation model 104 may also be, for example: a graphical model generated with a graphical modeling environment for modeling systems (e.g., Simulink® by The MathWorks, Inc.; Stateflow® by The MathWorks, Inc.; or VisSim by Visual Solutions); a graphical model generated with a graphical language (e.g., LabView® by National Instruments); a model generated with a text-based language; or a model generated with a text-based modeling language. The simulation model 104 may be, for example, code or model generated or created with other programming languages, whether industry standard or custom-designed.

Blocks 202-208 may be performed in the test environment 102.

In block 202, the test 103 may be generated. The test 103 may be generated by creating the test 103 in the test environment 102 and/or by loading a previously created test 103 into the test environment 102. The test 103 may include multiple sections and parts, such as, for example, a pre test section, an iterations part, a main test section, a save results part, and a post test section. Test elements may be added to the various test sections the test (e.g., to the pre test section, the main test section, and the post test section). The test may include a number of test elements. Test elements may be added, deleted, and changed in the test environment. One of the test elements of the test 103 may designate the simulation model 104. To include additional simulation models in the test 103, a test element may be used to designate each simulation model.

Figure 3:
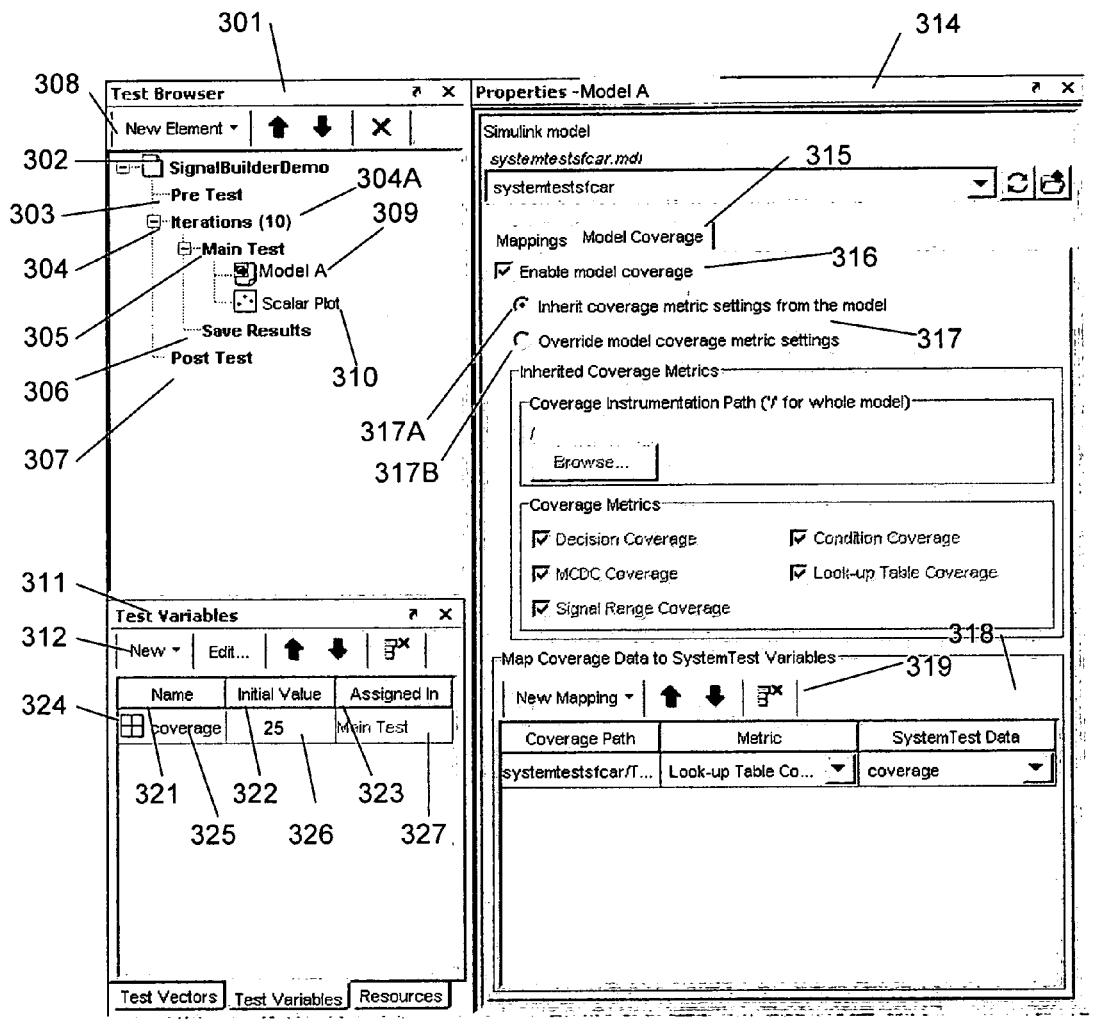
FIG. 3 depicts an exemplary graphical user interface for an exemplary test environment that can be used with an exemplary embodiment of the invention.

Referring to the exemplary graphical user interface for the exemplary test environment of FIG. 3, in a test browser window 301, a test 302 may be generated. Here, the test 302 is titled "SignalBuilderDemo." The test 302 may include a pre test section 303, an iterations part 304, a main test section 305, a save results part 306, and a post test section 307. A test may be added to the test browser 301 and test elements may be added, deleted, and changed to the test via a toolbar and/or a menu 308. Here, the main test section 305 of the test 302 includes two test elements, namely test elements 309 and 310. The test element 309 is for a simulation model (labeled "Model A"), which is a graphical model modeled with Simulink®. Further, the test element 310 (labeled "Scalar Plot") is for plotting data generated by the simulation model.

In block 203, test conditions 105 may be generated for the test 103. Test conditions 105 may specify the values of variables in the test 103 that vary during each iteration of the test 103, or section of the test 103. The test conditions 105 may be added, deleted, or changed in the test environment 102. Each test condition 105 may identify a variable in the test 105 and may include values for the variable for the test to iterate. In an exemplary embodiment, the test conditions 105 may be known as test vectors, where the values for the variable for the test to iterate may be provided in vector notation (e.g., such as the vector notation of MATLAB® or C++).

Figure 4:
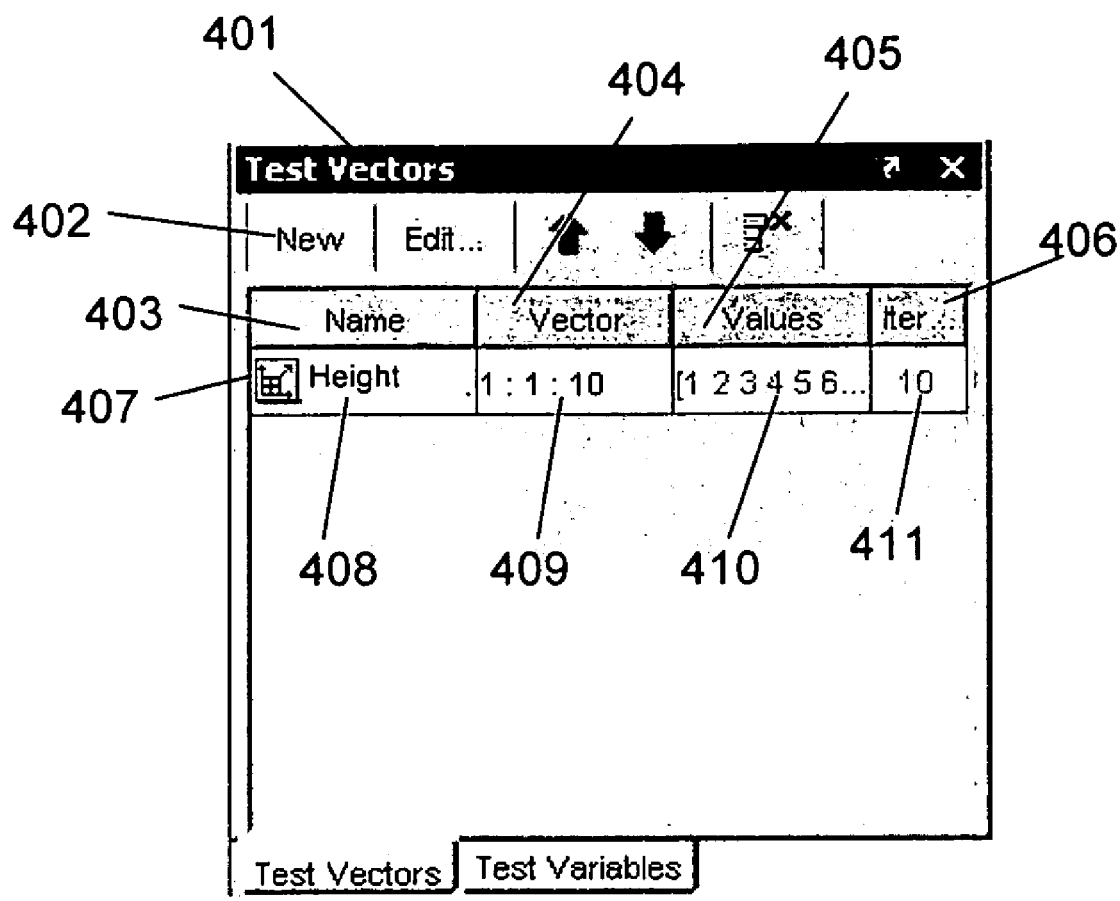
FIG. 4 depicts an exemplary graphical user interface for generating test vectors that can be used with an exemplary embodiment of the invention.

Referring to the exemplary graphical user interface of the exemplary embodiment of FIG. 4, in a test vectors window 401 of the test environment, test vectors may be added, deleted, or changed for running the test 302 via a menu 402. For each test vector, the user may designate the name 403 of the variable in the test 302 and a vector 404 identifying values for the variable. The test environment 102 may automatically identify the values 405 that the variable will take during the test 302 and the number of iterations 406 that the test, or section of the test, will be run based on the test vector.

In FIG. 4, one test vector 407 is generated for use when running the test 302. The test vector 407 is for the variable 408 named "Height" and identifies a vector 409 of values starting at 1 and going to 10 in steps of 1. The test environment 102 determined that the values 410 for the test vector 407 are [1 2 3 4 5 6 7 8 9 10] and that the iterations 411 for the test vector 407 are 10. Referring back to FIG. 3, the iterations part 304 for the test 302 include the designation 304A of "(10)", which the test environment automatically includes based on the iterations 411 from generated test vector 407. Additional test vectors may be added to the test 302 via the test vectors window 401. As test vectors are added, deleted, and changed, the designation 304A of the iterations part may be updated accordingly.

Referring back to FIG. 2, in block 204, temporary test variables 106 may be generated for the test 103. Each temporary test variable 106 may store data during the running of the test 103 regarding the test 103. The temporary test variables 106 are not actually part of the test 103. The temporary test variables 106 may be temporary and may not be saved after the test 103 is completed, unless specifically indicated to be saved. The test variables may be added, deleted, or changed in the test environment 102. Each test variable 106 may include an initial value and an indication of what portion of the test 103 that the test variable 106 should be initialized in.

Referring to FIG. 3, in a test variables window 311, temporary test variables may be added, deleted, or changed via a menu 312. For each temporary test variable, the user may designate a name 321 for the temporary test variable, an initial value 322 for the temporary test variable, and a designation 323 of which portion of the test 302 the temporary test variable applies. The designation 323 may designate a portion or all of the simulation model for which metric data is to be generated. Here, one temporary test variable 324 is generated for use by the test 302. The name 325 of the temporary test variable 324 is "coverage", and the temporary test variable 324 has an initial value 326 of 25 and has a designation 327 of being initialized in the main test section 305. Additional temporary test variable may be added to the test 302 via the test variables window 311.

Referring back to FIG. 2, in block 205, metric settings 107 may be specified for the simulation model 104 of the test 103. The metric settings may be used to perform measurements and/or calculate metrics regarding how well the test 103 exercised the simulation model 104. The metric settings 107 may be based on, for example, metrics provided by the test environment 102, metrics provided by the simulation model 104, and/or metrics provided by a user(s). The metric settings 107 may be specified based on selections from a menu of possible metrics. In an exemplary embodiment, a metric generation module may be included with the test environment 102 or may be a separately installed module for the test environment 102. The metric generation module may be used to generate metrics for the test 103. Block 205 may be implemented using the flow chart depicted in FIG. 5.

In an exemplary embodiment, for metric settings 107 based on metrics provided by the simulation model 104, an application program interface (API) may be provided for the test environment 102 to incorporate the metrics provided by the simulation model 104 into the test environment 102. To have the metrics provided by the simulation model 104 incorporated into the test environment 102, the simulation model 104 may need to comply with the requirements of the API. The API may allow the test environment 102 to interact with the metrics provided by the simulation model 104, such as, for example, directing the metrics to display in a graphical user interface in a particular form, or to provide the test environment 102 with information as to the metrics' dimension(s), data type(s), name, etc. As an option, the simulation model 104 may be provided by a third party, and the simulation model 104 may generate metrics and provide the generated metrics to the test environment by using the API.

Examples of the metric settings 107 that may be specified may include: model coverage, which may determine how well the test simulates the simulation model; code coverage, which may determine how well the test simulates the simulation model, when the simulation model is code; memory usage, which may determine how memory of the computer 101 is used during the test; parameter statistics, which may determine statistics of parameters in the test and/or simulation model; decision coverage, which may determine the percentage of simulation paths in the simulation model covered by the test (e.g., decision coverage may examine items that represent decision points in a model, such as, for example, Simulink® switch blocks or Stateflow® states); condition coverage, which may determine the percentage of logical elements of the simulation model covered by the test (e.g., condition coverage may examine blocks that output the logical combination of their inputs, such as, for example, Simulink® logic blocks or Stateflow® transitions); modified condition-decision coverage (MC/DC), which may determine whether each input of each logical element changed the output of the respective logical element during the test, while the other inputs to the respective logical element were held constant (e.g., MC/DC may analyze safety-critical software and may determine whether the logical inputs have independently changed the output); look-up table coverage, which may determine what percentage of each look-up table of the simulation model is covered by the test (e.g., lookup table coverage may record the frequency of usage for each interpolation interval, where a test may achieve full coverage if the test executes each interpolation and extrapolation interval at least once); signal range coverage, which may determine the minimum and maximum values generated by the simulation model during by the test (e.g., signal range coverage may indicate the minimum and maximum values generated during the simulation of each, for example, Simulink® block output or Stateflow® data object); cyclomatic complexity coverage, which determines the structural complexity of the simulation model covered by the test (e.g., cyclomatic complexity may measure the structural complexity of a simulation model by approximating the McCabe complexity measure for code generated from the model); and the like. Other test elements may have other metric settings.

Figure 5:
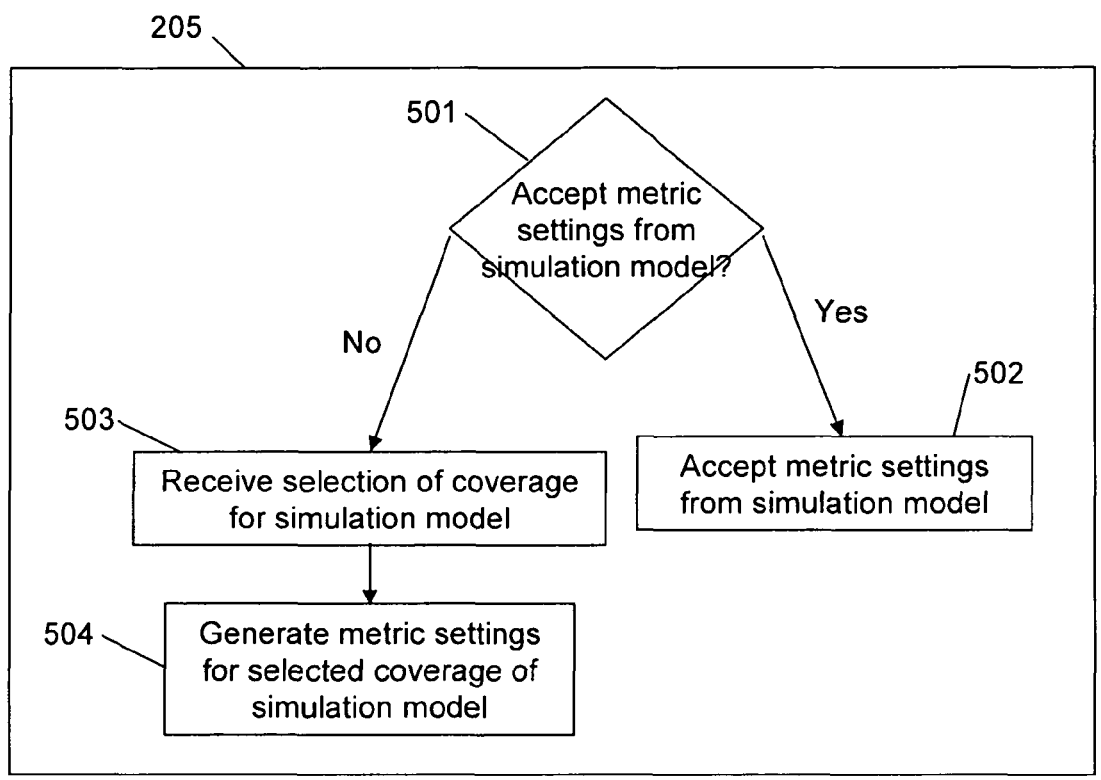
FIG. 5 depicts a flow chart for specifying metric settings for an exemplary simulation model that can be used with an exemplary embodiment of the invention.

FIG. 5 depicts a flow chart for specifying metric settings 107 for the simulation model 104 in block 205. In block 501, a determination is made whether or not to accept the metric settings from the simulation model 104. If the metric settings for the simulation model 104 are accepted, flow proceeds to block 502; otherwise, flow proceeds to block 503. Referring to FIG. 3, the Simulink® simulation model 309 (labeled "Model A") may be selected, and the selection may be denoted by highlighting the simulation model designation in the test 302. In a properties window 314 for the selected simulation model 309 of the exemplary graphical user interface, the model coverage tab 315 may be selected, and model coverage may be enabled via a selection menu 316. For example, the model coverage may be based on the Simulink® Verification and Validation module by The MathWorks, Inc. for use with a Simulink® model. If model coverage is selected for the simulation model 309, the determination as to whether or not to accept the metric settings from the simulation model 309 may be made via a section menu 317. If the metric settings are accepted for the simulation model 309, menu selection 317A is made (as in FIG. 3), and if the metric settings are not accepted for the simulation model 309, menu selection 317B is made (as in FIG. 6).

In block 502, the metric settings 107 for the simulation model 104 are accepted. The simulation model 104 may include previously identified metric settings 107, which may be configured within the simulation model 104.

Figure 6:
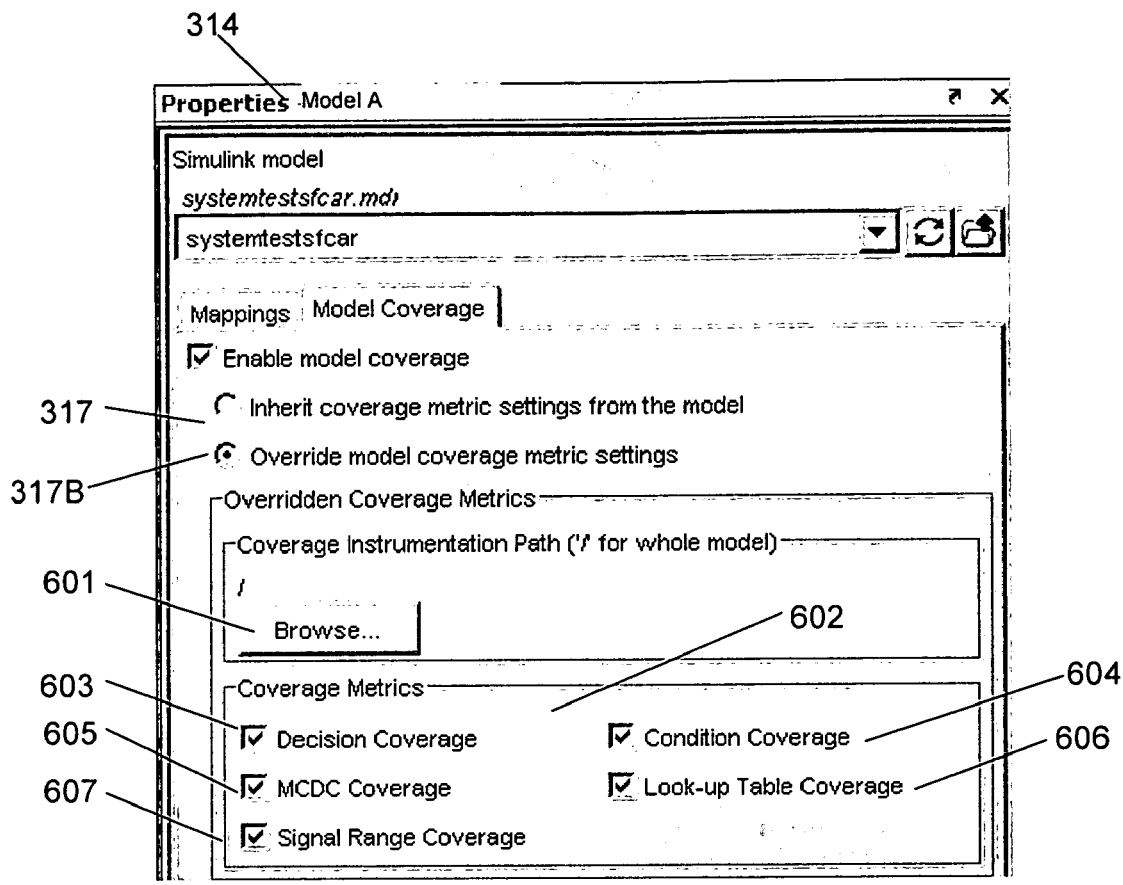
FIG. 6 depicts an exemplary graphical user interface for performing model coverage that can be used with an exemplary embodiment of the invention.
Figure 7:
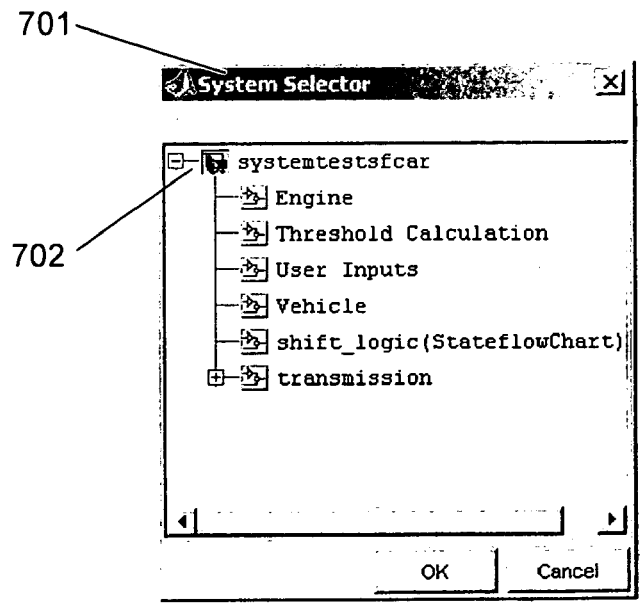
FIG. 7 depicts an exemplary graphical user interface for selecting a coverage path that can be used with an exemplary embodiment of the invention.

In block 503, the metric settings 107 for the simulation model 104 are not accepted, and a selection of coverage for the simulation model may be received. The coverage may designate which portions of the simulation model that the metric settings 107 should be used for. Referring to FIG. 6, the coverage may be determined by selection of the button 601. FIG. 7 depicts an exemplary graphical user interface for selecting a coverage path with the button 601. Upon selection of the button 601, a system selector window 701 may be opened, and the simulation model or one of its nested subsystem models may be selected as the coverage path. Here, the selected simulation model 702 (labeled "systemtestsfcar") is selected for coverage.

In block 504, a selection of metric settings 107 for the selected coverage of block 503 may be received. The test environment 102 may present a number of metric settings to select, and some or all of the metric settings may be selected. Referring to FIG. 6, an area 602 of the properties window 314 may provide for the receipt of a selection of one or more metric settings, such as, for example, decision coverage 603, condition coverage 604, MCDC coverage 605, look-up table coverage 606, and signal range coverage 607. Here, all of the possible metric settings 603-607 are selected.

Returning to block 206 in FIG. 2, mappings 108 may be generated between the specified metric settings 107 and the temporary test variables 106. For the simulation model 104, the metric settings 107 may be mapped to the temporary test variables 106. The mappings 108 may be added, deleted, or changed via the test environment 102. Referring to FIG. 3, in an area 318 of the properties window 314, the metric settings for the simulation model 309 may be mapped to the test variables. Via menu 319, mappings may be added, deleted, or changed. Block 206 may be implemented using the flow chart depicted in FIG. 8.

Figure 8:
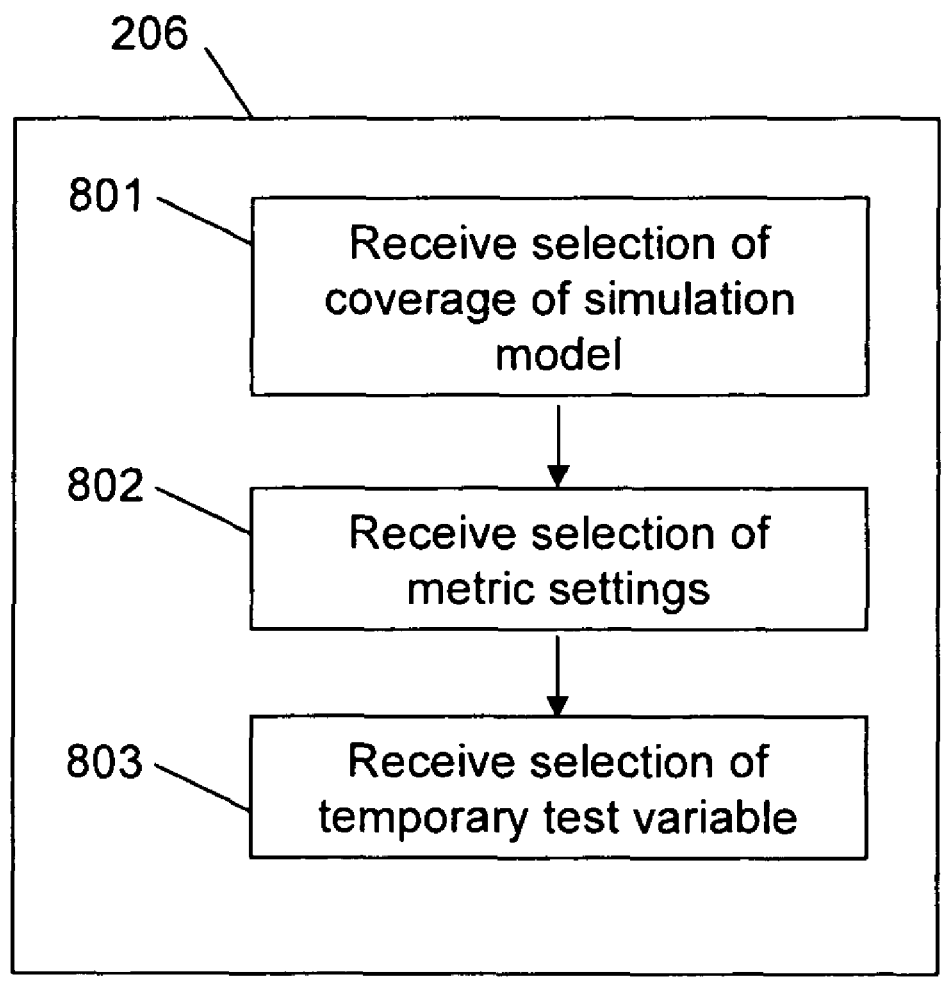
FIG. 8 depicts a flow chart for mapping metric settings to temporary test variables that can be used with an exemplary embodiment of the invention.
Figure 9:
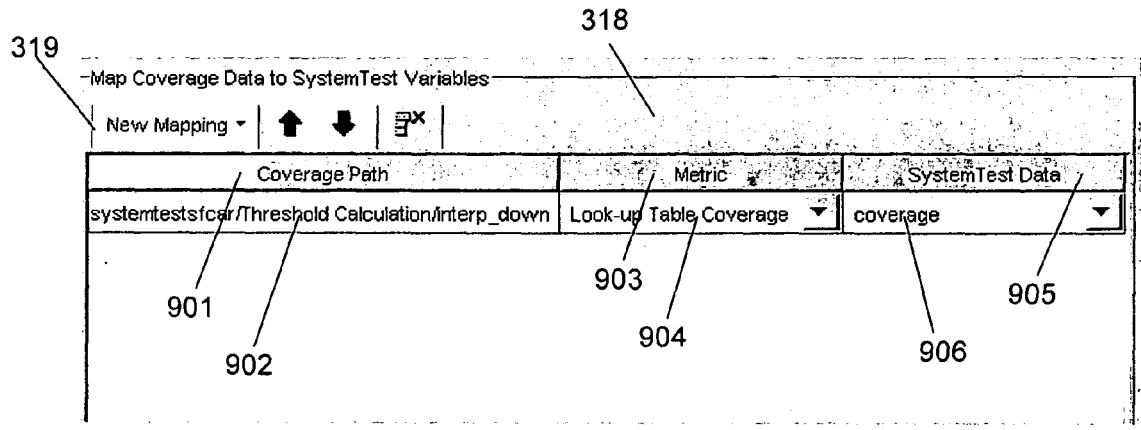
FIG. 9 depicts an exemplary graphical user interface for mapping metric settings to test variables that can be used with an exemplary embodiment of the invention.

FIG. 8 depicts a flow chart for generating mappings 108 between the metric settings 107 and the temporary test variables 106 in block 206. In block 801, a selection for the mapping 108 of the coverage of the simulation model 104 may be received. FIG. 9 depicts an exemplary graphical user interface for mapping metric settings to test variables and is an expanded version of area 318 in FIG. 3. In FIG. 9, a coverage path 901 may be selected via a selector window, such as the selector window 701 as depicted in FIG. 7, and the simulation model or one of its nested subsystem models may be selected for mapping. Here, the selected coverage path 902 is "systemtestsfcar/Threshold Calculation/interp_down".

In block 802, a selection for the mapping 108 of one metric setting may be received. The single metric setting may be selected from the metric settings 107 specified in block 205. In FIG. 9, a metric setting 903 may be selected. The possible metric settings choices may be the same or different than those available in area 602 of the properties window 314 in FIG. 6. Here, the selected metric setting is look-up table coverage 904.

In block 803, a selection for the mapping 108 of a temporary test variable may be received. The temporary test variable may be selected from the temporary test variables 106 generated in block 204. In FIG. 9, the test variable 905 may be selected via a menu. Here, the selected test variable is the "coverage" variable 906, which was created in the test variables window 311 and listed as the test variable 324 (named "coverage").

Blocks 801-803 may be performed in any order. Mappings 108 may be added, deleted, or changed via the test environment 102.

Figure 10:
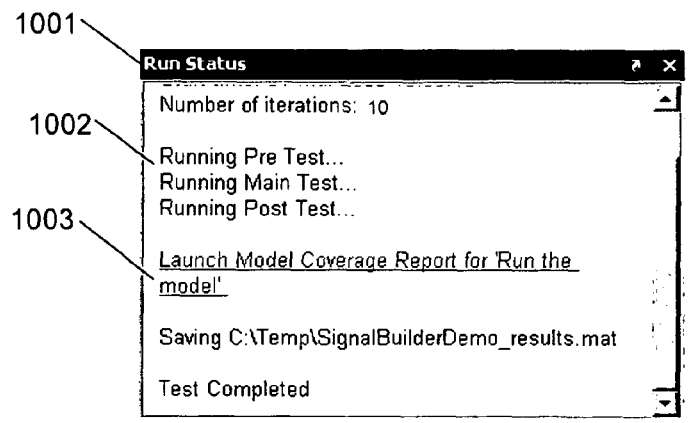
FIG. 10 depicts an exemplary graphical user interface for launching a coverage report that can be used with an exemplary embodiment of the invention.

Returning to block 207 in FIG. 2, the test 103 may be run, and metric data may be accumulated for the simulation model 104 based on the metric settings 107 and assigned to temporary test variables 106 based on the mappings 108. For each iteration of the test 103, or section of the test 103, values for the test variables in the test 103 may be changed according to the test conditions 105 generated in block 203, values may be determined for the temporary test variables 106 generated in block 204, and metric data may be calculated and assigned to test variables 106 based on the mappings 108 generated in block 206. After each iteration, the temporary test variables 106 are re-set to their initial values. For example, referring to FIG. 3, after each iteration, the temporary test variable 324 designated 327 as a main test section variable is re-set to its initial value 326, which was specified through the test variables window 311. FIG. 10 depicts an exemplary graphical user interface for a status window 1001. While the test 302 is being run, the status window 1001 may include status information 1002 on the test 302.

Figure 11:
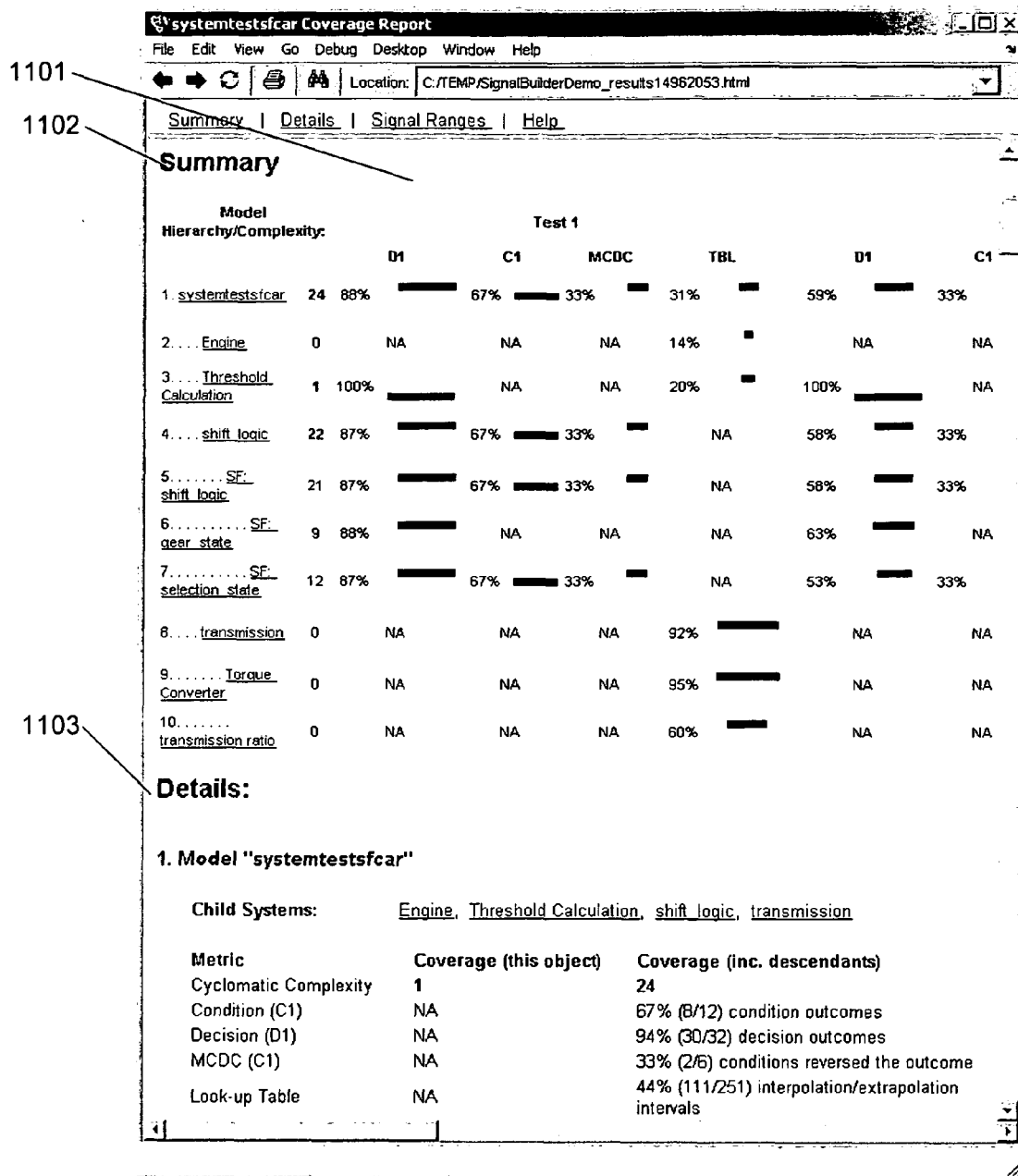
FIG. 11 depicts an exemplary graphical user interface for displaying a cumulative coverage report that can be used with an exemplary embodiment of the invention.

In block 208, cumulative metric data 109 may be generated based on the metric data accumulated over all iterations of the simulation model 104 by the mappings 108 in block 207. Further, the cumulative metric data 109 may be provided. For example, the cumulative metric data 109 may be provided via an output device of the computer 101 (e.g., displayed or printed), by storing the cumulative metric data 109 on a computer-readable medium of the computer 101, by being sent by the computer 101 to a destination via a network, and/or by being made available for further use within the test environment 102. A model coverage report may be generated based on the cumulative metric data 109. Referring to FIG. 10, the status window may include a link 1003 to launch a coverage report. Further, FIG. 11 depicts an exemplary graphical user interface for displaying an exemplary cumulative coverage report. In a coverage report window 1101 in FIG. 11, the cumulative coverage report may be presented. The cumulative coverage report may include a summary section 1102 and a details section 1103.

Figure 12:
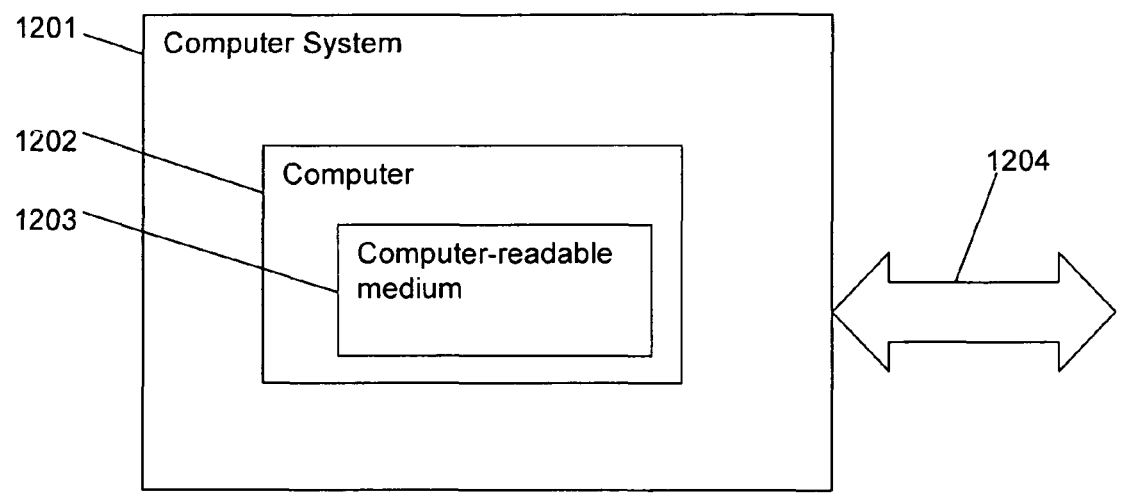
FIG. 12 depicts an exemplary computer system that can be used with use with the embodiments of the invention.

FIG. 12 depicts a computer system for use with the embodiments of the invention. The computer system 1201 may include a computer 1202 for implementing aspects of the exemplary embodiments described herein. The computer 1202 may include a computer-readable medium 1203 embodying software for implementing the invention and/or software to operate the computer 1202 in accordance with the invention. As an option, the computer system 1201 may include a connection to a network 1204. With this option, the computer 1202 may be able to send and receive information (e.g., software, data, documents) from other computer systems via the network 1204.

Exemplary embodiments of the invention may be embodied in many different ways as a software component. For example, it may be a stand-alone software package, or it may be a software package incorporated as a "tool" in a larger software product, such as, for example, a mathematical analysis product or a test generation product. It may be downloadable from a network, for example, a website, as a stand-alone product or as an add-in package for installation in an existing software application. It may also be available as a client-server software application, or as a web-enabled software application.

Figure 13:
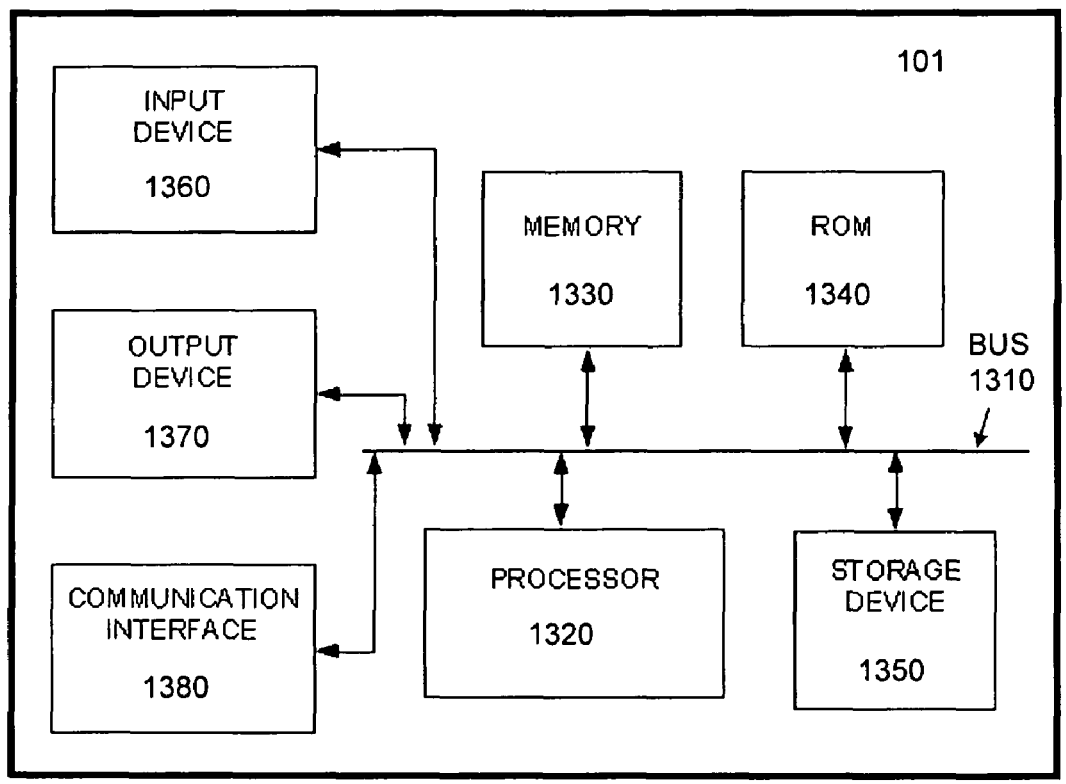
FIG. 13 depicts an exemplary architecture that can be used to implement the exemplary computer system of FIG. 12.

FIG. 13 illustrates an exemplary architecture for implementing the computer 101 of FIG. 1. It will be appreciated that other devices that can be used with the computer 101, such as a client or a server, may be similarly configured. As illustrated in FIG. 13, the computer 101 may include a bus 1310, a processor 1320, a memory 1330, a read only memory (ROM) 1340, a storage device 1350, an input device 1360, an output device 1370, and a communication interface 1380.

Bus 1310 may include one or more interconnects that permit communication among the components of computer 101. Processor 1320 may include any type of processor, microprocessor, or processing logic that may interpret and execute instructions (e.g., a field programmable gate array (FPGA)). Processor 1320 may include a single device (e.g., a single core) and/or a group of devices (e.g., multi-core). Memory 1330 may include a random access memory (RAM) or another type of dynamic storage device that may store information and instructions for execution by processor 1320. Memory 1330 may also be used to store temporary variables or other intermediate information during execution of instructions by processor 1320.

ROM 1340 may include a ROM device and/or another type of static storage device that may store static information and instructions for processor 1320. Storage device 1350 may include a magnetic disk and/or optical disk and its corresponding drive for storing information and/or instructions. Storage device 1350 may include a single storage device or multiple storage devices, such as multiple storage devices operating in parallel. Moreover, storage device 1350 may reside locally on computer 101 and/or may be remote with respect to computer 101 and connected thereto via a network and/or another type of connection, such as a dedicated link or channel.

Input device 1360 may include any mechanism or combination of mechanisms that permit an operator to input information to computer 101, such as a keyboard, a mouse, a touch sensitive display device, a microphone, a pen-based pointing device, and/or a biometric input device, such as a voice recognition device and/or a finger print scanning device. Output device 1370 may include any mechanism or combination of mechanisms that outputs information to the operator, including a display, a printer, a speaker, etc.

Communication interface 1380 may include any transceiver-like mechanism that enables computer 101 to communicate with other devices and/or systems, such as a client, a server, a license manager, a vendor, etc. For example, communication interface 1380 may include one or more interfaces, such as a first interface coupled to a network and/or a second interface coupled to a license manager. Alternatively, communication interface 1380 may include other mechanisms (e.g., a wireless interface) for communicating via a network, such as a wireless network. In one implementation, communication interface 1380 may include logic to send code to a destination device, such as a target device that can include general purpose hardware (e.g., a personal computer form factor), dedicated hardware (e.g., a digital signal processing (DSP) device adapted to execute a compiled version of a model or a part of a model), etc.

Computer 101 may perform certain functions in response to processor 1320 executing software instructions contained in a computer-readable medium, such as memory 1330. In alternative embodiments, hardwired circuitry may be used in place of or in combination with software instructions to implement features consistent with principles of the invention. Thus, implementations consistent with principles of the invention are not limited to any specific combination of hardware circuitry and software.

While various exemplary embodiments have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A computer-implemented method to generate cumulative metric data for a test in a test environment, the method comprising:
   specifying, from within the test environment, a plurality of test elements within an iterations part of the test, the plurality of test elements including:
      a first test element being a simulation model having a block property, the simulation model executed from within a second environment that is separate from the test environment, and
      a second test element that is not a simulation model, the second test element being executable;
   generating, from within the test environment, at least one test condition for the test, the at least one test condition specifying a number of values for the block property of the simulation model;
   specifying at least one metric setting for the simulation model;
   defining a test variable within the test environment;
   mapping, from within the test environment, the at least one metric setting of the simulation model to the test variable;
   running, by a computer, the test from within the test environment such that the simulation model is executed within the second environment for a plurality of iterations based on the number of block property values specified in the at least one test condition, and the second test element is executed for the plurality of iterations;

generating, during each iteration of the simulation model, metric data based on the at least one metric setting for the simulation model, the metric data generated within the second environment;

assigning the metric data generated in the second environment to the test variable of the test environment as a result of the mapping of the at least one metric setting of the simulation model to the test variable so that the metric data from the iterations of the simulation model is accumulated; and providing access to the accumulated metric data from within the test environment.

2. A computer-readable medium comprising software, which when executed by a computer system causes the computer system to perform operations in a computing environment to generate a test in a test environment, the operations comprising:

specifying, from within the test environment, a plurality of test elements within an iterations part of the test, the plurality of test elements including:
a first test element being a simulation model having a block property, the model executed from within a second environment that is separate from the test environment, and
a second test element that is not a simulation model, the second test element being executable;

generating, from within the test environment, at least one test condition for the test, the at least one test condition specifying a number of values for the block property of the simulation model;

specifying at least one metric setting for the simulation model;

defining a test variable within the test environment;

mapping, from within the test environment, the at least one metric setting of the simulation model to the test variable;

running, by a computer, the test from within the test environment such that the simulation model is executed within the second environment for a plurality of iterations based on the number of block property values specified in the at least one test condition, and the second test element is executed for the plurality of iterations;

generating, during each iteration of the simulation model, metric data based on the at least one metric setting for the simulation model, the metric data generated within the second environment;

assigning the metric data generated in the second environment to the test variable of the test environment as a result of the mapping of the at least one metric setting of the simulation model to the test variable so that the metric data from the iterations of the simulation model is accumulated; and providing access to the accumulated metric data from within the test environment.

3. A system to generate a test in a test environment, the system comprising:

means for specifying, from with the test environment, a plurality of test elements for the test, the plurality of test elements including:
a first test element being a simulation model having a block property, the simulation model executed from within a second environment that is separate from the test environment, and
a second test element that is not a simulation model, the second test element being executable;

means for generating, from within the test environment, at least one test condition for the test, the at least one test condition specifying a number of values for the block property of the simulation model;

means for specifying at least one metric setting for the simulation model;

means for defining a test variable within the test environment;

means for mapping, from within the test environment, the at least one metric setting of the simulation model to the test variable;

means for running the test from within the test environment such that the simulation model is executed within the second environment for a plurality of iterations based on the number of block property values specified in the at least one test condition, and the second test element is executed for the plurality of iterations;

means for generating, during each iteration of the simulation model, metric data based on the at least one metric setting for the simulation model, the metric data generated within the second environment;

means for assigning the metric data generated in the second environment to the test variable of the test environment as a result of the mapping of the at least one metric setting of the simulation model to the test variable so that the metric data from the iterations of the simulation model is accumulated; and means for providing access to the accumulated metric data from within the test environment.

4. The method as in claim 1, wherein the at least one test condition includes a starting value, an ending value, and an incrementing step value for the block property of the simulation model.

5. The method as in claim 1, wherein the at least one metric setting is provided by the test environment.

6. The method as in claim 1, wherein the at least one metric setting is provided by the simulation model.

7. The method as in claim 1, wherein the at least one metric setting is provided by a user.

8. The method as in claim 1, further comprising:
designating a portion of the simulation model for which the metric data is to be generated.

9. The method as in claim 1, further comprising:
designating that the metric data is to be generated for all of the simulation model.

10. The method as in claim 1, wherein the mapping comprises:
designating a coverage path for the simulation model.

11. The method as in claim 1, wherein the at least one metric setting is selected from a group consisting of:
model coverage, code coverage, memory usage, parameter statistics, decision coverage, condition coverage, modified condition-decision coverage (MC/DC), look-up table coverage, signal range coverage, and cyclomatic complexity coverage.

12. The method as in claim 1, wherein the simulation model is generated with a matrix-based mathematical programming language, a graphical modeling environment, a graphical language, a text-based language, or a text-based modeling language.

13. The computer-readable medium as in claim 2, wherein the at least one test condition includes a starting value, an ending value, and an incrementing step value for the block property of the simulation model.

14. The computer-readable medium as in claim 2, wherein the at least one metric setting is provided by the test environment.

15. The computer-readable medium as in claim 2, wherein the at least one metric setting is provided by the simulation model.

16. The computer-readable medium as in claim 2, wherein the at least one metric setting is provided by a user.

17. The computer-readable medium as in claim 2, wherein the operations further comprise:

designating a portion of the simulation model for which the metric data is to be generated.

18. The computer-readable medium as in claim 2, wherein the operations further comprise:

designating that the metric data is to be generated for all of the simulation model.

19. The computer-readable medium as in claim 2, wherein the operations further comprise:

designating a coverage path for the simulation model.

20. The computer-readable medium as in claim 2, wherein the at least one metric setting is selected from a group consisting of:

model coverage, code coverage, memory usage, parameter statistics, decision coverage, condition coverage, modified condition-decision coverage (MC/DC), look-up table coverage, signal range coverage, and cyclomatic complexity coverage.

21. The computer-readable medium as in claim 2, wherein the simulation model is generated with a matrix-based mathematical programming language, a graphical modeling environment, a graphical language, a text-based language, or a text-based modeling language.

* * * * *

UNITED STATES PATENT AND TRADEMARK OFFICE
CERTIFICATE OF CORRECTION

PATENT NO.         : 8,346,526 B1                                Page 1 of 1
APPLICATION NO.    : 11/647595
DATED              : January 1, 2013
INVENTOR(S)        : Christian A. Portal et al.

It is certified that error appears in the above-identified patent and that said Letters Patent is hereby corrected as shown below:

In the Specification

In col. 11, line 22 should read:
block property, the <u>simulation</u> model executed from within a In col. 11, line 57 should read:
means for specifying, from with<u>in</u> the test environment, the Signed and Sealed this
Twenty-fifth Day of June, 2013

Teresa Stanek Rea
*Acting Director of the United States Patent and Trademark Office*